(12) United States Patent
DeAngelo et al.

(10) Patent No.: US 9,130,093 B2
(45) Date of Patent: Sep. 8, 2015

(54) METHOD AND APPARATUS FOR ASSEMBLING PHOTOVOLTAIC CELLS

(75) Inventors: Joseph O. DeAngelo, Winters, CA (US); Sara Kieu Lesperance, San Jose, CA (US); Kasiraman Krishnan, San Jose, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 476 days.

(21) Appl. No.: 13/223,242

(22) Filed: Aug. 31, 2011

(65) Prior Publication Data

US 2013/0052770 A1 Feb. 28, 2013

(51) Int. Cl.
*H01L 21/00* (2006.01)
*H01L 31/05* (2014.01)
*H01L 31/18* (2006.01)

(52) U.S. Cl.
CPC ........ *H01L 31/0504* (2013.01); *H01L 31/0512* (2013.01); *H01L 31/18* (2013.01); *H01L 31/188* (2013.01); *Y02E 10/50* (2013.01); *Y10T 29/53191* (2015.01); *Y10T 29/53261* (2015.01); *Y10T 29/53265* (2015.01)

(58) Field of Classification Search
USPC ................ 438/67–80; 257/E21.499, E31.11; 29/743–760
See application file for complete search history.

(56) References Cited

U.S. PATENT DOCUMENTS

| | | | | |
|---|---|---|---|---|
| 2007/0074755 | A1* | 4/2007 | Eberspacher et al. | 136/244 |
| 2008/0230118 | A1* | 9/2008 | Nakatani et al. | 136/255 |
| 2008/0264481 | A1* | 10/2008 | Hayes | 136/256 |
| 2010/0029038 | A1* | 2/2010 | Murakawa | 438/97 |
| 2010/0184251 | A1* | 7/2010 | Aslami et al. | 438/73 |

* cited by examiner

*Primary Examiner* — Charles Garber
*Assistant Examiner* — Abdulfattah Mustapha
(74) *Attorney, Agent, or Firm* — Sawyer Law Group, P.C.

(57) ABSTRACT

A method of assembling a matrix of photovoltaic cells includes positioning photovoltaic cells in a desired orientation, aligning the row of photovoltaic cells relative to each other, and enabling a homogeneous downward pressure on the row of photovoltaic cells to facilitate electrical and mechanical connectivity between the photovoltaic cells.

20 Claims, 5 Drawing Sheets

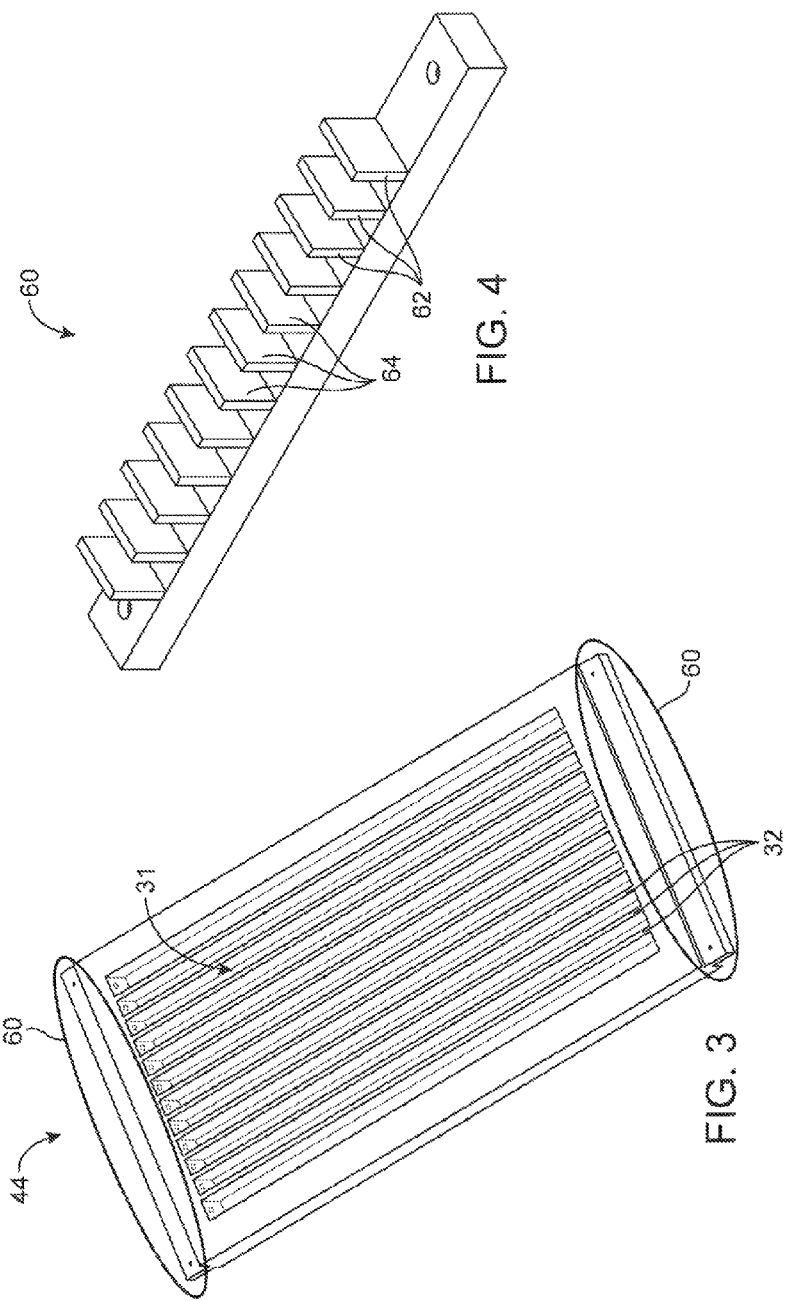

METHOD AND APPARATUS FOR ASSEMBLING PHOTOVOLTAIC CELLS

BACKGROUND OF THE INVENTION

1. Field of the Invention

This invention relates generally to the manufacturing of photovoltaic cells and particularly to assembly of a matrix of photovoltaic cells during manufacturing.

2. Description of the Prior Art

Photovoltaic cells (also commonly referred to as "solar cells") have gained overwhelming popularity for a variety of applications in recent years, particularly in light of increasing utility costs and environmental concerns. Photovoltaic cells are generally assembled and encapsulated by manufacturers before being shipped to users for use into various applications. Flexible photovoltaic cells, which are a group of cells placed adjacently relative to each other but in a manner is flexible rather than rigid and are assembled by mounting the cells on flexible plastic substrate (or "semiconductor"), such as polyimide, PEEK or transparent conductive polyester film or on metal foil A group of photovoltaic cells, i.e. matrix of cells, are interconnected, electrically and mechanically during manufacturing but are typically vulnerable to mechanical integrity issues related to the interconnected photovoltaic cells in addition to reduced electrical performance and lower yield causing increased manufacturing costs. These problems are further exacerbated when large numbers of flexible cells are to be positioned in precise alignment during manufacturing. Assembly of matrices requires alignment of the matrix of photovoltaic cells before the matrix is cured in an oven. During alignment however, because the cells are not uniform and have varying sizes, or the chuck used to align them is warped, alignment is not uniform and results in a non-flat surface, adversely impacting yield and reliability of the matrix.

Currently, one of the ways of aligning of a matrix assembly is done by taping the matrix to glass to align a matrix before it is interconnected, which leaves tape residue on the photovoltaic cell, is slow and inaccurate. Also, the interconnection of the cells of the matrix is not flat. Problems with other techniques include throughput or yield.

What is needed is a method and apparatus for reliable and accurate assembly of a matrix of flexible photovoltaic cells.

SUMMARY OF THE INVENTION

To overcome the limitations in the prior art described above, and to overcome other limitations that will become apparent upon reading and understanding the specification, the invention discloses a method and a corresponding structure for assembling photovoltaic cells during manufacturing thereof.

Briefly, a method of assembling a matrix of photovoltaic cells includes positioning photovoltaic cells in a desired orientation, aligning the row of photovoltaic cells relative to each other, and enabling a homogeneous downward pressure on the row of photovoltaic cells to facilitate electrical and mechanical connectivity between the photovoltaic cells.

These and other objects and advantages of the present invention will no doubt become apparent to those skilled in the art after having read the following detailed description of the various embodiments illustrated in the several figures of the drawing.

IN THE DRAWINGS

FIG. 3 shows further details of the matrix chuck 44, in accordance with an embodiment of the invention.

FIG. 4 shows a perspective angular view of a row chuck placer 60 of FIG. 3.

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention.

A method of assembling a matrix of photovoltaic cells is disclosed to include positioning photovoltaic cells in a desired orientation, aligning the row of photovoltaic cells relative to each other, and enabling a homogeneous downward pressure on the row of photovoltaic cells to facilitate electrical and mechanical connectivity between the photovoltaic cells.

Alternatively, the photovoltaic cells are aligned relative to each other, by interconnection, through, for example, electrical interconnection. Still alternatively, the photovoltaic cells are aligned relative to each other and in a row.

Figure 1:
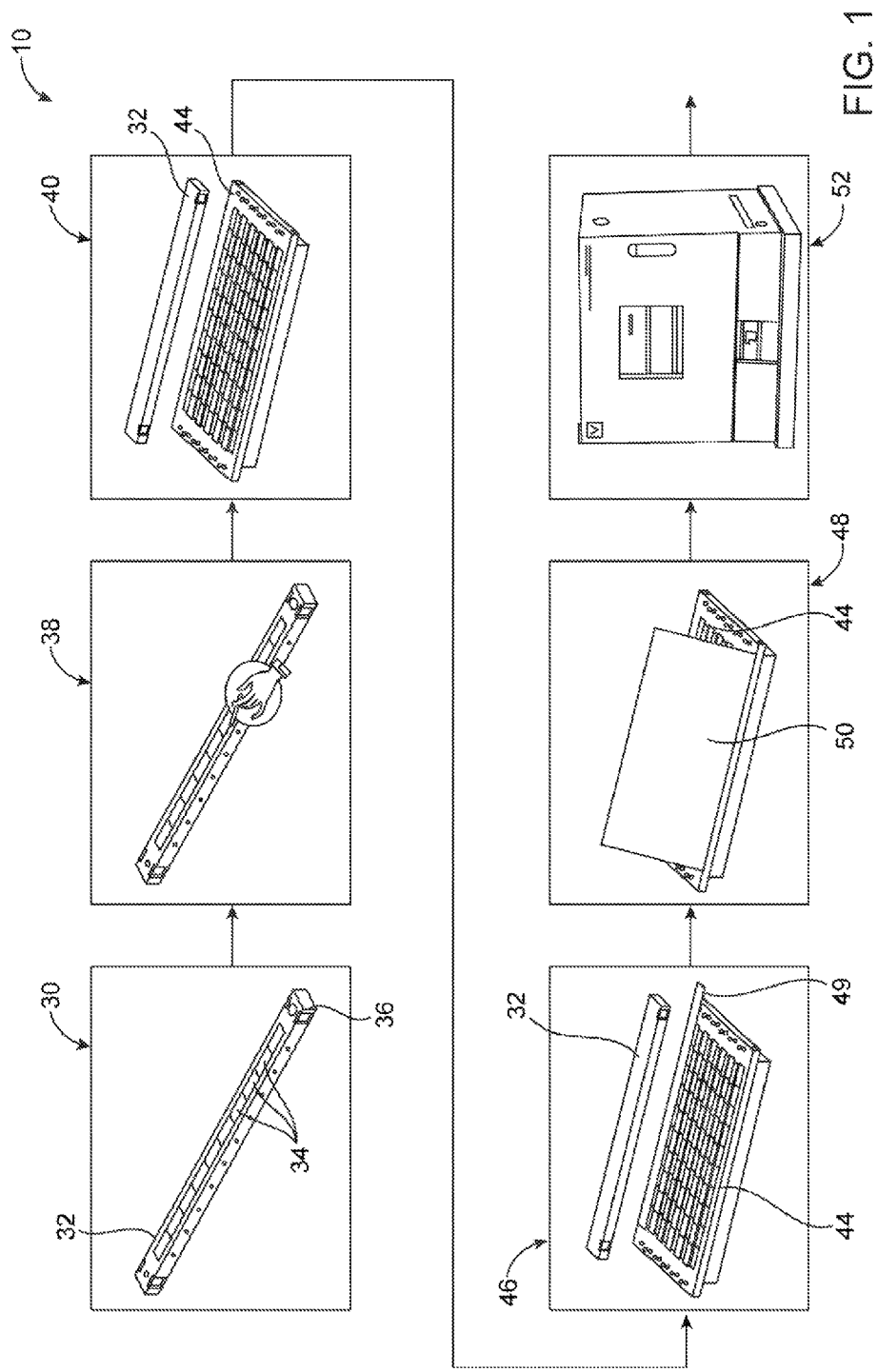
FIG. 1 shows the relevant steps for assembling a matrix of photovoltaic cells, in accordance with a method of the invention.

FIG. 1 shows the relevant steps for assembling a matrix of photovoltaic cells, in accordance with a method of the invention. At step 30, a row chuck 32 is shown to include a number of photovoltaic cells that are aligned relative to each other and held in place by vacuum with each cell processing its own independently-controlled vacuum chamber 34. A row alignment guide extends outwardly from the bottom surface of the row chuck 32 that is used by an operator to guide the row chuck into a matrix chuck, shown in subsequent figures. The row chuck 32 serves to hold the cells together in a row and aligned.

At step 38, electrically-conductive adhesive (also referred to herein as "bonding material"), such as but not limited to epoxy or solder, is applied to the cells while the cells are in the row chuck 38 to help the cells remain in place and maintain alignment. Alternatively, the electrically-conductive adhesive is applied before the step 30, to the cells. The electrically-conductive adhesive holds the cells together electrically as well as mechanically. The bonding material can be silver or other metal-filled epoxy or any other suitable electrically conductive bonding material, including but not limited to solders, silicone, and the like.

At step 40, alignment is performed of the cells relative to each other or relative to each other, in a row, or both. During this step, the row chuck 32 is inverted or turned upside down and placed (or set) into a matrix chuck 44. The matrix chuck 44 has a matrix chuck alignment groove (not shown in FIG. 2) that mates with the row chuck alignment tab 36 of the row chuck 32 allowing the row chuck 32 to be placed in a precise location in the matrix chuck 32. In exemplary embodiments, the row chuck 32 is placed at a 17.1 millimeter pitch in the matrix chuck 44. That is each row of photovoltaic cells is placed 17.1 millimeters apart from an adjacent row of cells therefore allowing vias to be inserted into an alignment pin, discussed relative to a subsequent figure.

Next, at step 46, a ribbon 49 is placed on top of the row chuck 32. A matrix has at least two leads attached thereto, a positive lead and a negative lead. These leads are placed along a row of cells and each cell has a positive and a negative connection. For the cells on the end of the rows, the cells are either positively exposed or negatively exposed. The ribbon is used to connect to the cells at the end of the row.

Next, at step 48, a cover film 50 is placed on top of the matrix chuck 44. The cover film 50 is typically very thin, flexible and heat-resistant. In some embodiments, the cover film 50 is a high-temperature polyethylene terephthalate (PET), or vacuum bagging materials, as WL3900 and Secur-Lon from Airtech, or other suitable material. The cover film 50 is pulled down and over the photovoltaic cells using vacuum pressure to ensure intimate contact between the cells over the entire matrix. That is, vacuum is applied with uniform pressure to the matrix 44 causing the cells to mate intimately at their electrical/mechanical interface to each other during curing. The cover film 50, after a subsequent curing step, places a homogeneous downward pressure on the photovoltaic cells to facilitate electrical and mechanical connectivity between the cells. During the subsequent curing step, the cover film 50 advantageously holds the cells flat against each other. Accordingly, cell damage is minimized.

The vacuum leakage around the photovoltaic cells of the row chuck 32 draws down the cover film 50 around the cells causing atmospheric pressure to draw down the cover film 50 onto the cells evenly. Thus, even if there is non-homogeneity of the surface of the cells, the cover film 50 causes a substantially flat surface on top thereof and therefore suitable interconnectivity of the cells relative to each other. Next, at step 52, the matrix chuck 44 is cured by being placed in an oven, with vacuum pressure applied, for curing. In some embodiments, curing is done at approximately 150 degrees Celsius. The curing temperature is typically a function of the electrically-conductive adhesive of step 38. Alternatively, the oven is not used and rather, a heated blanket is placed on top of the matrix chuck 44 for curing.

The row chuck 32 has row chuck vacuum chambers, as will be shown in subsequent figures. Similarly, the matrix chuck 44 has matrix chuck vacuum chambers. Each row has its own matrix chamber vacuum chamber. At step 40, when the row chuck 32 is placed onto the matrix chuck 44, the matrix chuck vacuum chamber, for that row, is turned 'on' and the row chuck vacuum chambers of all other rows are turned 'off' thereby enabling the transfer of the cells from the row chuck 32 to the matrix chuck 44.

In accordance with the steps of FIG. 1, multiple small interconnects, between the flexible photovoltaic cells, are ensured to be reliably interconnect the cells to each other. A large number of flexible cells are held in precise alignment during electrical and mechanical bonding operations.

In summary, the method of assembling a matrix of photovoltaic cells includes positioning photovoltaic cells in a desired orientation, or row, as shown at step 30, aligning the row of photovoltaic cells relative to each other, as shown at step 40, and enabling a homogeneous downward pressure on the row of photovoltaic cells to facilitate electrical and mechanical connectivity between the plurality of photovoltaic cells.

Alternatively, the photovoltaic cells are aligned relative to each other, at step 40, by interconnecting them, through, for example, by electrical interconnection, or an interconnect material that can be an electrically-conductive adhesive. Still alternatively, the photovoltaic cells are aligned relative to each other and in a row.

In some embodiments, the steps of FIG. 1 are performed automatically.

Figure 2:
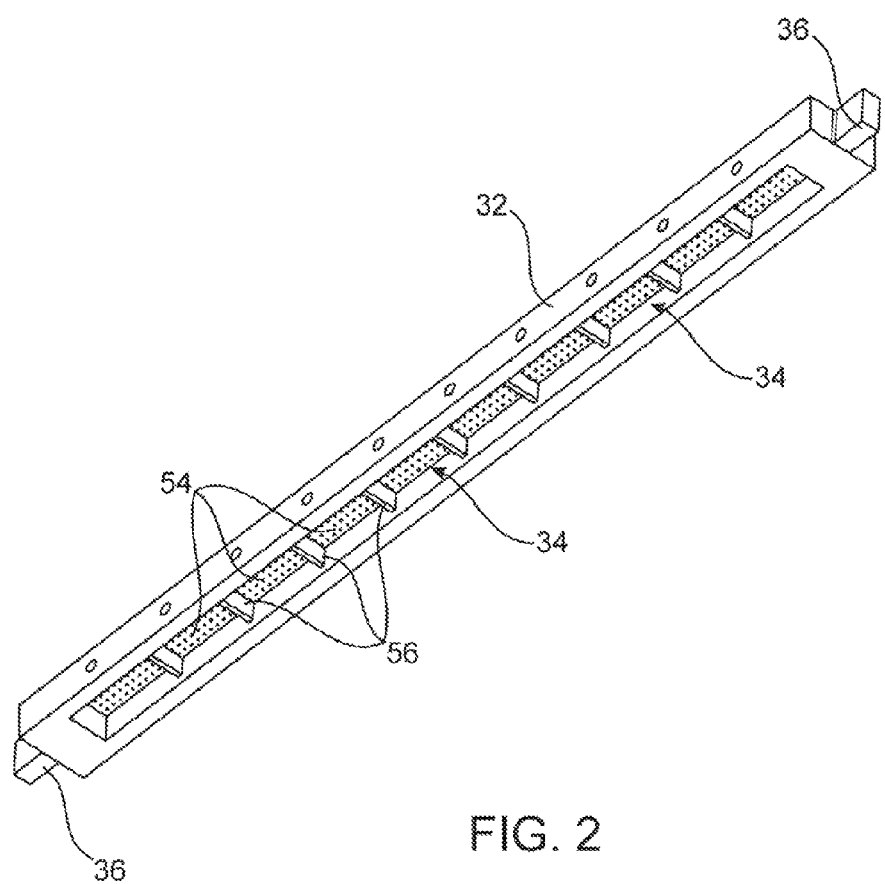
FIG. 2 shows further details of the row chuck 32, in accordance with an embodiment of the invention.

FIG. 2 shows further details of the row chuck 32, in accordance with an embodiment of the invention. The row chuck 32 is shown to have a number of photovoltaic cells 54, arranged and aligned in a row, at the bottom surface of which are a number of row chuck vacuum chambers 34, separated by row chuck tabs 56, which each extend across horizontally, at the bottom surface side of the row chuck 32, and which separate the vacuum chambers 34 from one another. As shown, each cell 54 has an associated vacuum chamber 34 that can be turned on and off independently of other row chuck vacuum chambers thereby aiding in the alignment of the cells.

Each of the tabs 36 is shown protruding from either end of the row chuck 32 and used to guide the row chuck 32 into a matrix chuck in a subsequent step.

In the matrix chuck 44 as well as the row chuck 32, each row of photovoltaic cells has its own vacuum chamber that can be turned on and/or off independently of other rows advantageously requiring less vacuum air flow.

FIG. 3 shows further details of the matrix chuck 44, in accordance with an embodiment of the invention. The chuck 44 is shown to include a number of row chucks 32 having a row chuck placer 60 located at either end of the chuck 44, the row chucks 32 being placed in between the placers 60, in length-wise orientation. Each row chuck 32 is aligned precisely due to the placers 60, which are shown in greater detail in FIG. 4.

FIG. 4 shows a perspective angular view of a row chuck placer 60 of FIG. 4. The placer 60 is shown to have a number of matrix chuck tabs 62 extending outwardly and each having a height suitable for holding, in place, a row chuck. The tabs 62 are located apart from each other with each tab separated from another by a matrix chuck groove 64 into which a tab 36 is inserted during the step 40 of FIG. 1. In an exemplary embodiment, each groove is 17.1 millimeters.

Figure 5:
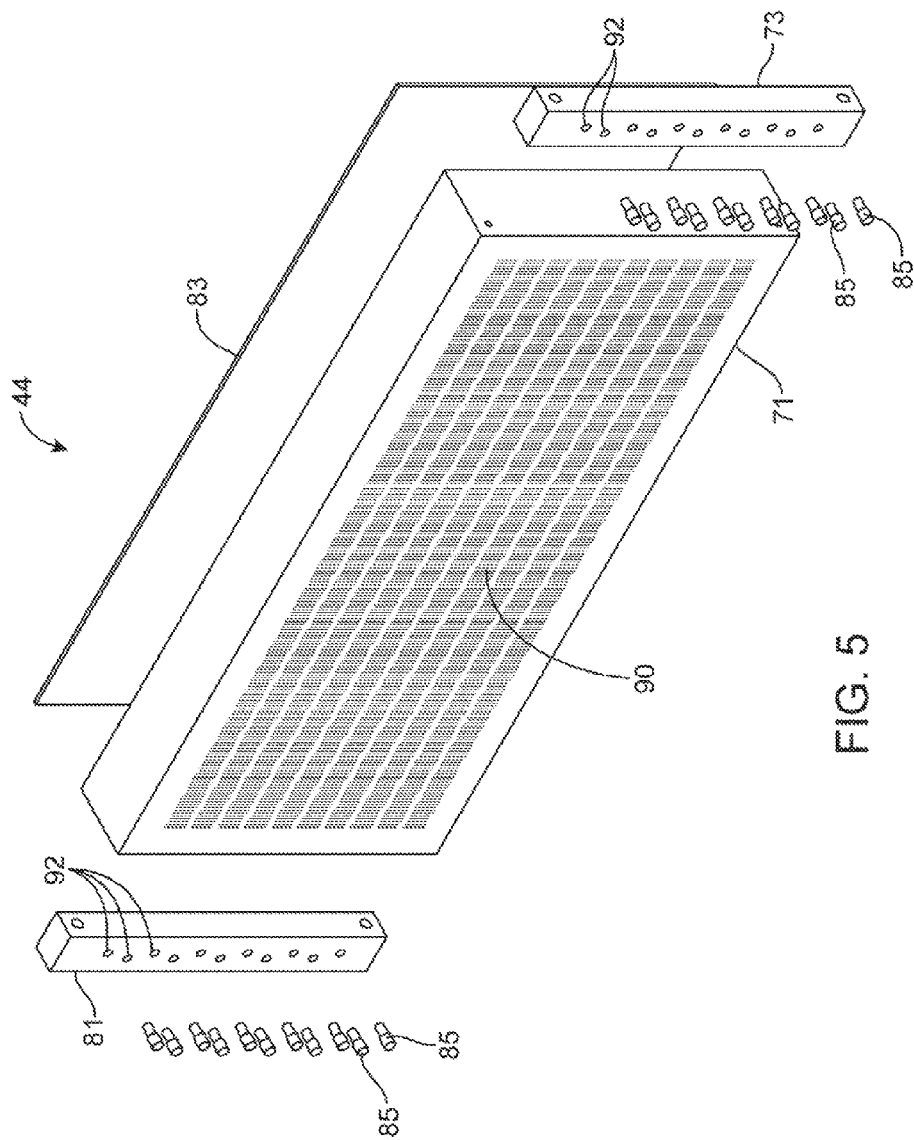
FIG. 5 shows a perspective side angular view of the matrix chuck 44, in accordance with an embodiment of the invention.

FIG. 5 shows a perspective side angular view of the matrix chuck 44, in accordance with an embodiment of the invention. The chuck 44 is shown to include a heat cover 71, which is analogous to the cover film 50, and a right side insert 73, a left-side insert 81, alignment pins 85, and a vacuum base cover 83. Each of the inserts 73 and 81 is placed on either side of the matrix of photovoltaic cells 90, which include a number of row chucks 32. Each of the inserts 73 and 81 includes a number of vias into which a via 85 is inserted to secure the row chucks 32.

Figure 6:
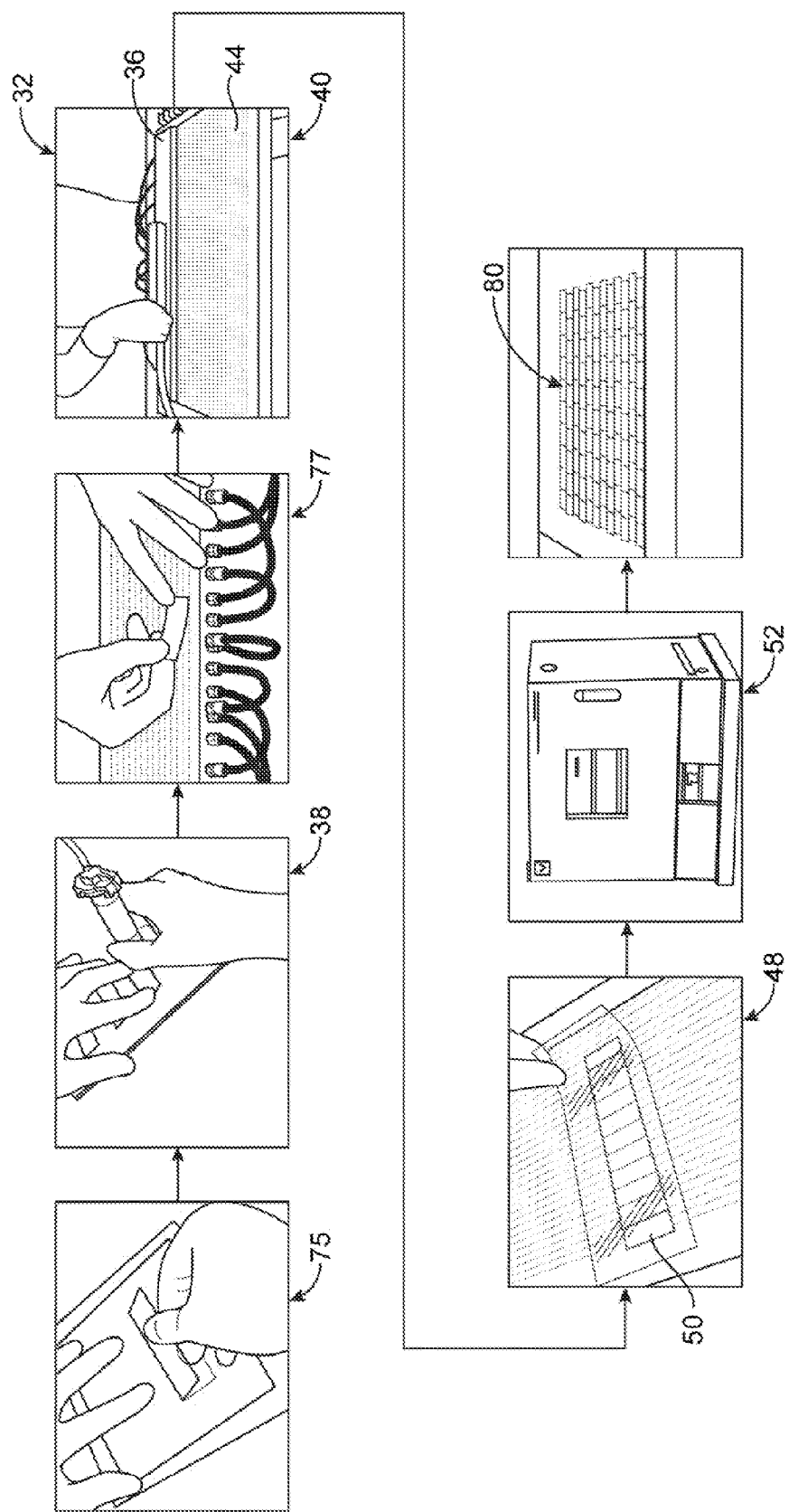
FIG. 6 shows the relevant steps of assembling a matrix of photovoltaic cells in accordance with another embodiment of the invention.

FIG. 6 shows the relevant steps of assembling a matrix of photovoltaic cells in accordance with another embodiment of the invention. At step 75, insulation of the photovoltaic cells is optionally performed. Alternatively, this insulation is not performed or it is replaced by dispensing liquid dielectric material. Next, at step 38, the electrically-conductive adhesive is applied to the cells, followed by setting each photovoltaic cell into the row chuck 32, at step 77, one cell at a time. When placing the cells on the row chuck 32, each row chuck vacuum chamber 34, which is associated with each cell, may be turned 'on' as each cell is placed on the row chuck 32. When the row chuck 32 is placed on the matrix chuck 44, the matrix chuck vacuum chamber 31 on the matrix chuck for that row is turned 'on', and all other matrix chuck vacuum chambers in the matrix chuck 44 are turned 'off', thereby transferring all cells from the row chuck 32 to the matrix chuck 44, in their properly aligned configuration.

Next, at step 40, as previously discussed, a single row of cells, in a row chuck, is set into the matrix chuck 44, one row or row chuck at a time, followed by the cover film 50 being placed on top of the matrix chuck at step 48 and the matrix chuck being cured at step 52 with the completed matrix shown at 80. In exemplary embodiments, the row chuck 32 includes 10 to 33 photovoltaic cells. In some embodiments, the steps of FIG. 6 are performed automatically.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of assembling a matrix of flexible photovoltaic cells comprising:
   positioning a plurality of photovoltaic cells in a desired orientation;
   aligning at least some of the plurality of photovoltaic cells relative to each other; and
   placing a cover film on top of the plurality of photovoltaic cells wherein the cover film is pulled down and over the plurality of photovoltaic cells using a uniform vacuum pressure causing the cells to mate intimately at their electrical/mechanical interface during curing and wherein a homogeneous downward pressure on the plurality of photovoltaic cells facilitates electrical and mechanical connectivity between the plurality of photovoltaic cells after curing.

2. The method of assembling a matrix, as recited in claim 1, wherein the aligning step includes aligning the photovoltaic cells relative to each other.

3. The method of assembling a matrix, as recited in claim 1, wherein the at least some of the plurality of photovoltaic cells are a row of photovoltaic cells.

4. The method of assembling a matrix, as recited in claim 1, further including forming a matrix of photovoltaic cells.

5. The method of assembling a matrix, as recited in claim 1, wherein setting at least some of the plurality of photovoltaic cells in a row chuck during the positioning step, the at least some of the plurality of photovoltaic cells being aligned relative to one another.

6. The method of assembling a matrix, as recited in claim 5, wherein the aligning step includes mating the row chuck on a matrix chuck.

7. The method of assembling a matrix, as recited in claim 6, wherein the row chuck is one of a plurality of row chucks and the aligning step includes placing each of the plurality of row chucks into a matrix chuck, row chuck at a time.

8. The method of assembling a matrix, as recited in claim 7, wherein the row chuck has row chuck alignment tabs, one at either end, and where during the aligning step, each of the row chuck alignment tabs is used to guide the row chuck into a matrix chuck.

9. The method of assembling a matrix, as recited in claim 8, wherein the plurality of row chucks includes a plurality of row chuck vacuum chambers, each row chuck vacuum chamber independently being turned 'on' and 'off'.

10. The method of assembling a matrix, as recited in claim 9, wherein the matrix chuck includes a plurality of matrix chuck vacuum chambers, each matrix chuck vacuum chamber independently being turned 'on' and 'off'.

11. The method of assembling a matrix, as recited in claim 10, wherein when the row chuck is placed on the matrix chuck, the matrix chuck vacuum chamber on the matrix chuck for that row is turned 'on', and all other matrix chuck vacuum chambers in the matrix chuck are turned 'off', thereby transferring all cells from the row chuck to the matrix chuck, in their properly aligned configuration.

12. The method of assembling a matrix, as recited in claim 1, further including the step of applying an interconnect material to the row chuck before the aligning step.

13. The method of assembling a matrix, as recited in claim 12, wherein the interconnect material is an electrically-conductive adhesive.

14. The method of assembling a matrix, as recited in claim 12, wherein the interconnect material is a solder.

15. An apparatus for making a matrix of photovoltaic cells comprising a row chuck holding a plurality of photovoltaic cells, the plurality of photovoltaic cells being positioned and aligned in a row on the row chuck, the row chuck having, at two ends thereof, a row chuck alignment tab for guiding the row chuck into a matrix chuck, wherein the plurality of photovoltaic cells are transferred from the row chuck to the matrix chuck; and causing the cells to mate intimately at their electrical/mechanical interface during curing by utilizing a cover film for causing a homogeneous downward pressure on the plurality of photovoltaic cells to facilitate electrical and mechanical connectivity between the plurality of photovoltaic cells after curing.

16. The apparatus for making a matrix of photovoltaic cells, as recited in claim 15, wherein the plurality of photovoltaic cells are transferred from the row chuck to the matrix chuck using vacuum pressure.

17. The apparatus for making a matrix of photovoltaic cells, as recited in claim 15, wherein the row chuck has a plurality of row chuck alignment tab, at least one of which protrudes from one end of the row chuck and another of which protrudes from an opposite thereof, the plurality of row chuck alignment tab mate with a matrix chuck when the row chuck is placed on the matrix chuck.

18. The apparatus for making a matrix of photovoltaic cells, as recited in claim 16, wherein the matrix chuck includes at least two matrix chuck tabs, separated by a matrix chuck groove, wherein the row chuck alignment tab are placed in the matrix chuck groove to mate the row chuck with the matrix chuck.

19. The apparatus for making a matrix of photovoltaic cells, as recited in claim 15, wherein the matrix chuck includes a plurality of row chuck vacuum chambers and the matrix chuck has a plurality of matrix chuck vacuum chambers, each row chuck having a corresponding matrix chuck vacuum chamber that is independently turned 'on' and 'off'.

20. A method of assembling a matrix of flexible photovoltaic cells comprising:
   positioning a plurality of photovoltaic cells in a row chuck;
   aligning the plurality of photovoltaic cells; and
   placing a cover film over the plurality of photovoltaic cells;
   wherein the cover film is pulled down and over the plurality of photovoltaic cells using a uniform vacuum pressure causing the cells to mate intimately at their electrical/mechanical interface during curing to facilitate electrical and mechanical connectivity between the plurality of photovoltaic cells after curing.

* * * * *